(12) United States Patent
Hou et al.

(10) Patent No.: US 12,418,982 B2
(45) Date of Patent: Sep. 16, 2025

(54) LAMINATED STRUCTURE WITH PADS AND MANUFACTURING METHOD THEREOF

(71) Applicant: Taiwan Semiconductor Manufacturing Company, Ltd., Hsinchu (TW)

(72) Inventors: Hao-Cheng Hou, Hsinchu (TW); Tsung-Ding Wang, Tainan (TW); Jung-Wei Cheng, Hsinchu (TW); Chien-Hsun Chen, Pingtung County (TW); Chien-Hsun Lee, Hsin-chu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 429 days.

(21) Appl. No.: 17/709,461

(22) Filed: Mar. 31, 2022

(65) Prior Publication Data
US 2023/0319991 A1     Oct. 5, 2023

(51) Int. Cl.
| | |
|---|---|
| H05K 1/11 | (2006.01) |
| G01R 1/073 | (2006.01) |
| H05K 1/02 | (2006.01) |
| H05K 1/09 | (2006.01) |
| H05K 1/14 | (2006.01) |
| H05K 1/18 | (2006.01) |
| H05K 3/24 | (2006.01) |

(52) U.S. Cl.
CPC ......... *H05K 1/113* (2013.01); *G01R 1/07342* (2013.01); *H05K 1/0271* (2013.01); *H05K 1/09* (2013.01); *H05K 1/144* (2013.01); *H05K 1/181* (2013.01); *H05K 3/244* (2013.01); *H05K 2201/032* (2013.01); *H05K 2201/099* (2013.01); *H05K 2201/10015* (2013.01); *H05K 2203/1333* (2013.01)

(58) Field of Classification Search
CPC ........ H05K 1/113; H05K 1/0271; H05K 1/09; H05K 1/144; H05K 1/181; G01R 1/07342
USPC ....................................................... 174/261
See application file for complete search history.

(56) References Cited

U.S. PATENT DOCUMENTS

| | | | |
|---|---|---|---|
| 2020/0273804 A1* | 8/2020 | Jeon | H01L 24/20 |
| 2022/0068864 A1* | 3/2022 | Kuo | H01L 23/31 |

\* cited by examiner

*Primary Examiner* — Tremesha W Burns
(74) *Attorney, Agent, or Firm* — JCIPRNET

(57) ABSTRACT

A laminated structure and the manufacturing methods thereof are provided. The structure includes an interconnect substrate having a first surface and a second surface opposite to the first surface, an insulating encapsulant laterally wrapping the interconnect substrate, and a redistribution structure disposed on the first surface of the interconnect substrate and electrically connected with the interconnect substrate. The redistribution structure has a third surface facing the first surface and a fourth surface opposite to the third surface. The redistribution structure includes first pads, second pads located beside the first pads, and protective patterns disposed on the first pads and covering the first pads. The first pads include pad portions protruded from the fourth surface and the protective patterns are in contact with sidewalls and top surfaces of the pad portions of the first pads.

20 Claims, 18 Drawing Sheets

LAMINATED STRUCTURE WITH PADS AND MANUFACTURING METHOD THEREOF

BACKGROUND

Testing technology is useful not only for testing wafer level packaged devices but also for testing semiconductor devices sold as bare dies or known good dies (KGD) for semiconductor manufacturing. Probe cards are commonly used for electrical testing of IC chips on a wafer during the wafer test process. The reliability of probe cards has significant impact on the results of the testing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
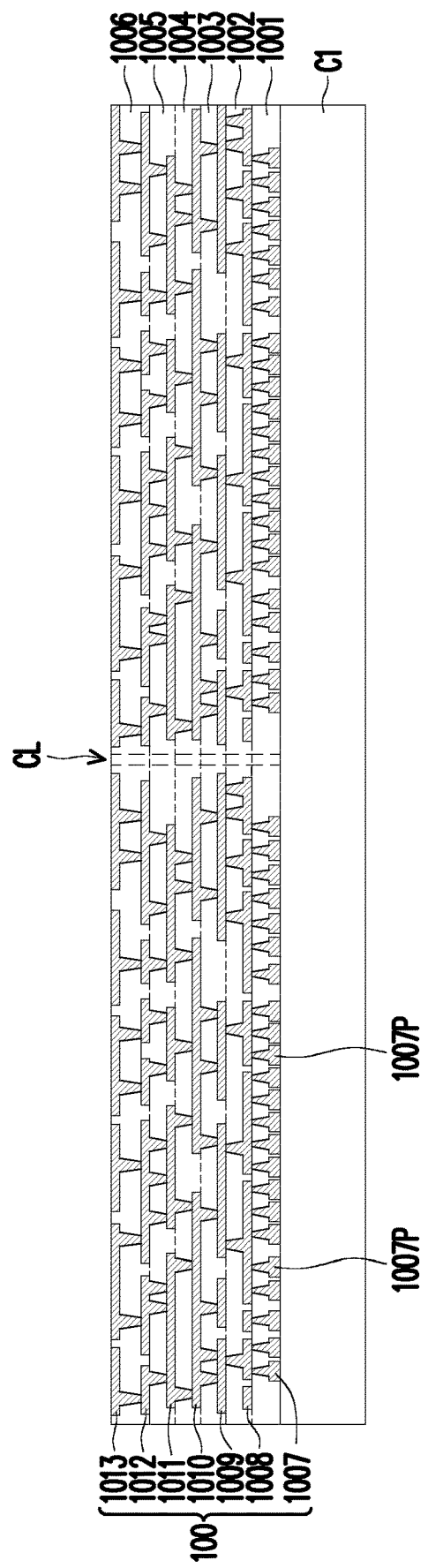
FIG. 1 to FIG. 17 illustrate schematic cross-sectional views and schematic top views showing a laminated structure at various stages of the manufacturing method for forming probe card substrates with pad structures according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of a laminated structure and the probe card substrates fabricated there-from. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure. The embodiments are intended to provide further explanations but are not used to limit the scope of the present disclosure.

For testing processes, probe cards are commonly used, and a probe card is a testing component docked to a prober to serve as a connector between the electrodes/test pads of the IC chip or the wafer and the tester apparatus. The needles of the probe card contact the electrodes or test pads to conduct electrical testing.

As the dimensions and pitches keep reducing, advanced probe cards such as vertical probe cards or MEMS probe cards are developed, which are suitable for wafer level testing. Vertical probe cards are advantageous in tests of semiconductor devices with area array pads, and MEMS probe cards can be fabricated using variously shaped probes, which are made by MEMS process.

A probe card structure principally includes a printed circuit board (PCB), a probe card substrate electrically connected with the PCB, and a probe head mounted onto the probe card substrate. As the pads (probe pads) on the probe card substrate may receive or accommodate the probes or spring probes of the probe head, the pads require probing endurance and oxidation resistance. In some cases, the use of a cover layer with increased hardness as described in the following embodiments may improve the reliability of the probe pads and the conduction of electrical connections between the probe head and the probe card substrate and between the probe card and the device(s) under test (DUT). In some cases, the techniques described herein may be used with other typical fabrication processes for the pad fabrication in any laminated substrate or circuit substrate. Additionally, through the pad designs as described may result in improved yield and improved connection reliability, especially for probe cards. For example, the pad design described herein may provide better protection of the pads from repeated probing contact and moisture attack.

FIG. 1 to FIG. 17 illustrates schematic cross-sectional views and schematic top views showing a laminated structure at various stages of the manufacturing method for forming probe card substrates with probe pad structures according to some embodiments of the present disclosure. FIG. 1, FIG. 3, FIG. 9, FIG. 10, FIG. 12, FIG. 14 and FIG. 16 are schematic cross-sectional views showing the laminated structure at various stages of the manufacturing method according to some embodiments of the present disclosure. FIG. 5 through FIG. 8 are schematic enlarged cross-sectional views showing a portion of the laminated structure with probe pads at various stages of the manufacturing method according to some embodiments of the present disclosure. FIG. 2, FIG. 4, FIG. 11, FIG. 13, FIG. 15 and FIG. 17 are schematic top views showing the laminated structure similar to the structures shown in FIG. 1, FIG. 3, FIG. 10, FIG. 12, FIG. 14 and FIG. 16 respectively.

Figure 2:
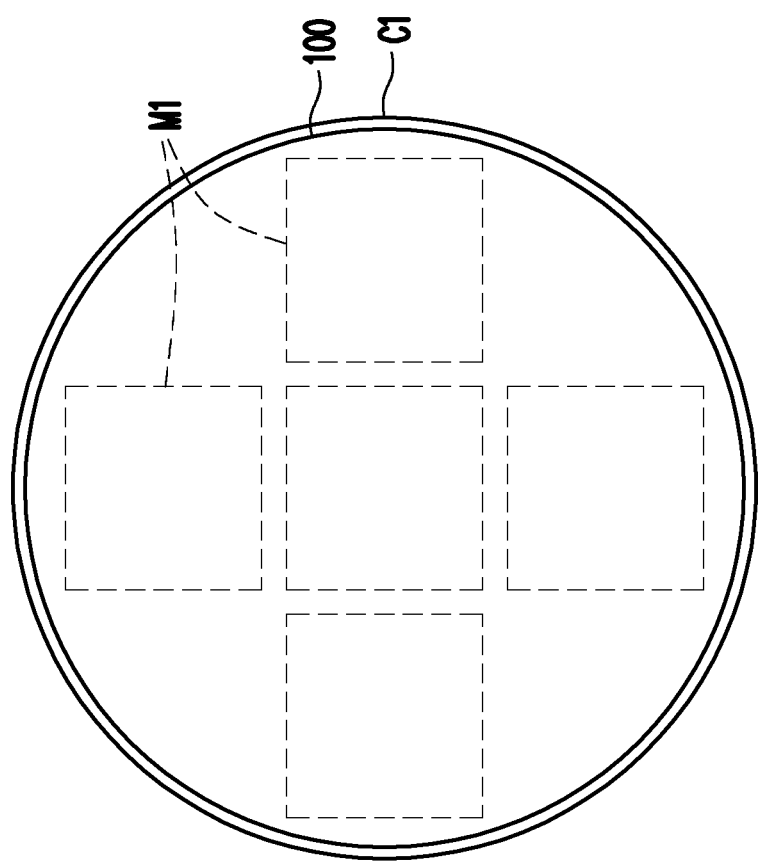

Referring to FIG. 1 and FIG. 2, in certain embodiments, a carrier C1 is provided and a redistribution structure 100 is formed over the carrier C1. In some embodiments, the carrier C1 may include, for example, a glass material, a plastic material, a silicon-based material, such as silicon oxide or a silicon substrate (e.g., a silicon wafer), or other oxide materials, such as aluminum oxide, or a combination thereof. In some embodiments, the carrier C1 may be in a wafer shape or in a panel shape, and function as a supporting substrate formed from a suitable supporting material. In one embodiment, the carrier C1 may include a debond layer (not shown).

Referring to FIG. 1, in some embodiments, the formation of the redistribution structure 100 includes sequentially forming multiple dielectric layers 1001-1006 and multiple conductive layers 1007-1013 in alternation. In some embodiments, the redistribution structure 100 includes six dielectric layers 1001-1006 and seven conductive layer 1007-1013 as shown in FIG. 1, where the conductive layers are sandwiched between the dielectric layers. It is understood that the numbers of the dielectric layers and the conductive layers included in the redistribution structure 100 is not limited thereto, and may be designated and selected based on the product demands.

In certain embodiments, the material of the dielectric layers 1001-1006 may be polyimide, polybenzoxazole (PBO), benzocyclobutene (BCB), a nitride material such as silicon nitride, an oxide material such as silicon oxide, phosphosilicate glass (PSG), borosilicate glass (BSG), boron-doped phosphosilicate glass (BPSG), or a combination thereof. In some embodiments, the material of the dielectric layers 1001-1006 may be formed by suitable fabrication techniques such as spin-on coating, lamination or deposition such as chemical vapor deposition (CVD), atomic layer deposition (ALD) or the like.

In some embodiments, the conductive layers 1007-1013 are metallic layers and may include seed layers (not shown). In some embodiments, the material of the conductive layer 1007-1013 may include conductive metallic materials formed by electroplating or deposition, such as aluminum, titanium, copper, nickel, cobalt, tungsten, nitrides thereof, alloys thereof or combinations thereof. In some embodiments, the dielectric layers 1001-1006 may be patterned using a photolithography and/or etching process to form openings, and the conductive layers 1007-1013 may be formed by filling in the openings and then patterned using photolithography and etching processes. In some embodiments, the conductive layers 1007-1013 includes routing lines, pads, under-bump metallization (UBM) patterns, and interconnecting vias or other suitable patterned metallic layers. In one embodiment, the bottommost conductive layer 1007 includes bump pads 1007P, and the bumps pads 1007P may further include under-bump metallization (UBM) (not shown). It is understood that the metallization patterns of the conductive layers 1007-1013 may have different dimensions or pitches. For example, the metallization patterns of the top conductive layer 1013 may be formed with greater pitches than one or more of the metallization patterns of the underlying conductive layers 1007-1012, while the metallization patterns of the bottommost conductive layer 1007 may be formed with smaller pitches than one or more of the metallization patterns of the above conductive layers 1008-1012.

Referring to FIG. 1 and FIG. 2, the redistribution structure 100 formed on the carrier C1 may include several mounting regions M1 (shown in dotted lines) for receiving the later mounted interconnect substrates (FIG. 12) and the subsequently cutting will be performed at the cutting lanes CL along the mounting regions M1.

Figure 3:
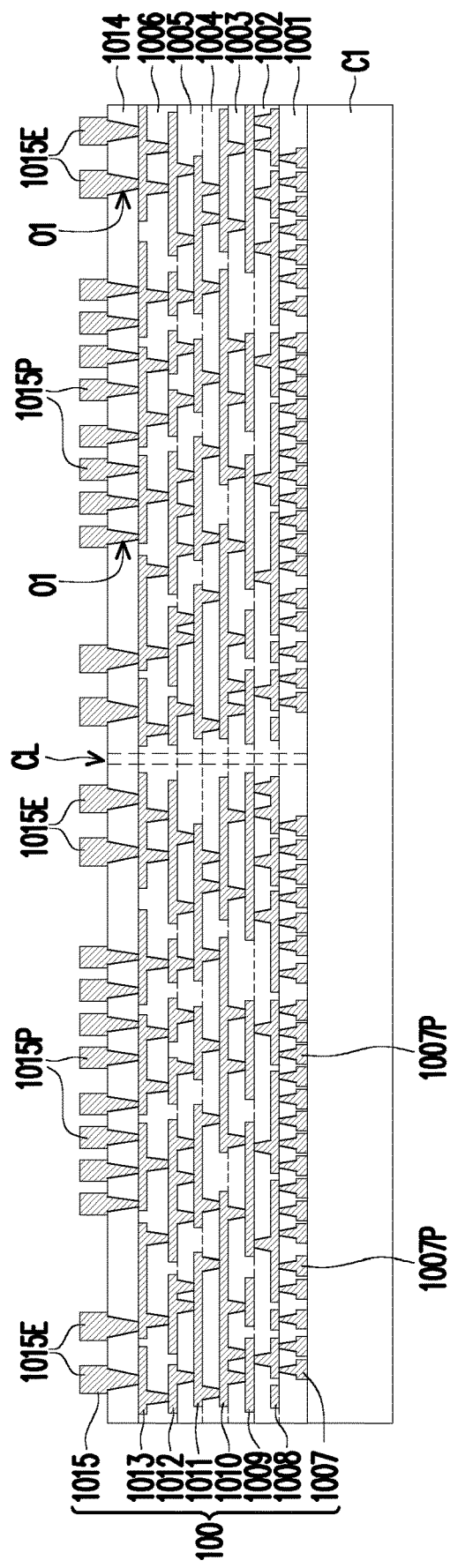
Figure 4:
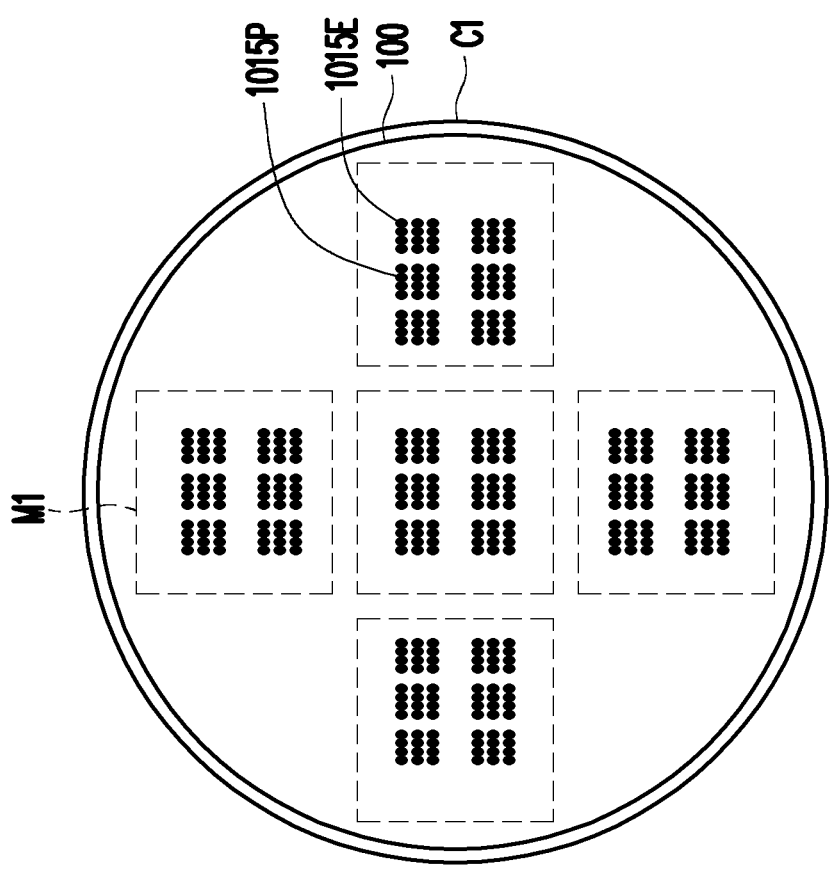

Referring to FIG. 3 and FIG. 4, in some embodiments, another dielectric layer 1014 is formed on the dielectric layer 1006 and the conductive layer 1013. The dielectric layer 1014 may be formed by spin coating, lamination, CVD, the like, or a combination thereof. In some embodiments, the dielectric layer 1014 includes a photo-sensitive dielectric material such as PBO, polyimide, or BCB, and the dielectric layer 1014 is patterned through photolithography and etching processes to form openings O1 exposing portions of the conductive layer 1013. Later, another conductive layer 1015 is formed on the dielectric layer 1014 by forming a conductive metallic material (not shown) filling up the openings and then patterned to remove the extra metallic material.

In some embodiments, the conductive layer 1015 includes core pads 1015P and peripheral pads 1015E located besides the core pads 1015P. In one embodiment, each pad includes a via portion V1 filling in the openings O1 and a top pad portion P1 located above and connected with the via portion V1, the top pad portion P1 is protruded out of and located above the top surface of the dielectric layer 1014 and the via portion V1 extends through the dielectric layer 1014 to be physically and electrically connected to the underlying conductive layer 1013. In some embodiments, the core pads 1015P and the peripheral pads 1015E are arranged in arrays. In some embodiments, the core pads 1015P may be formed in smaller pitches and dimensions while the peripheral pads 1015E may be formed in larger pitches and dimensions. As described before, the formation of the conductive layer 1015 may involves forming a seed layer (not shown) through physical vapor deposition (PVD) over the openings O1 of the dielectric layer 1014, and the seed layer may be a single metallic layer or a composite layer comprising a plurality of sub-layers formed of different metal or metallic materials. In some embodiments, the conductive layer 1015 comprises a titanium seed layer and a copper conductive layer over the titanium layer. In some embodiments, the dielectric layer 1014 and the conductive layer 1015 may be considered as part of the redistribution structure 100. The materials and the formation methods of the dielectric layer 1014 and the conductive layer 1015 may be the same with or similar to the previously described dielectric layers 1001-1006 and the conductive layers 1007-1013, and detailed descriptions will not be repeated herein. In some embodiments, the metallization patterns of the conductive layer 1015 may have different dimensions than those of the metallization patterns of the below conductive layers. For example, the pads of the conductive layer 1015 may be wider or thicker than the metallization patterns of the below conductive layers. Further, the pads of the conductive layer 1015 may be formed to a greater pitch than those of the below the conductive layers.

From the schematic enlarged cross-sectional views as seen in FIG. 5 through FIG. 8, a first portion (left portion) including the peripheral pad 1015E and a second portion (right portion) including the core pad 1015P of the laminated structure are shown. It is understood that the dielectric layers and conductive layers are shown to provide relative laminating relationships but the construction of the laminated structure should not be limited by the configurations of the layers and the metallization patterns therein.

Figure 5:
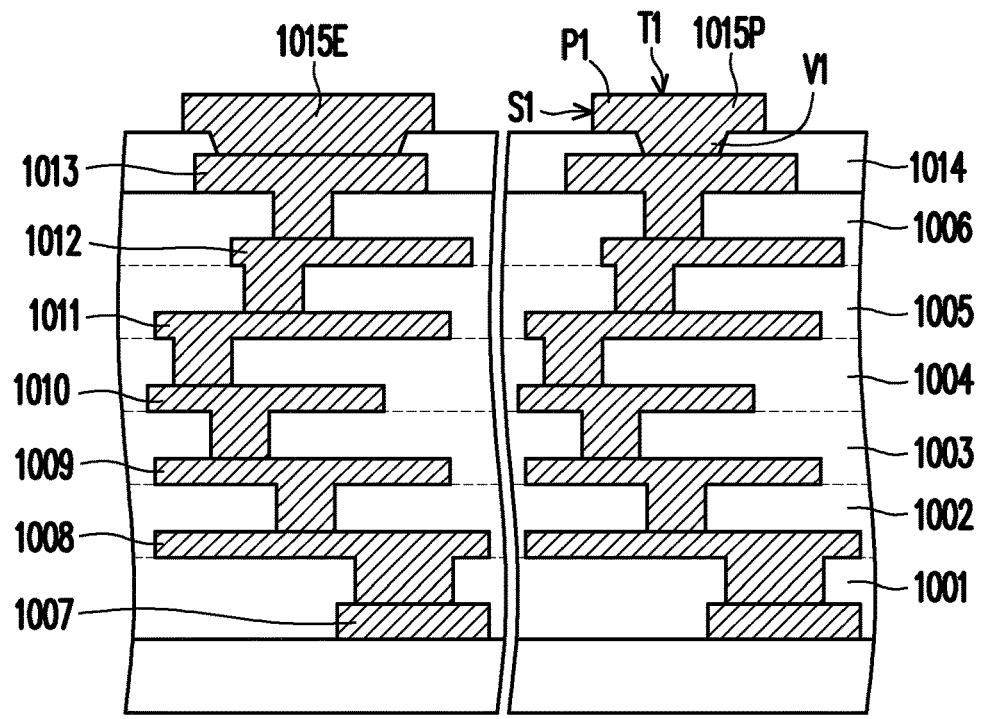
Figure 6:
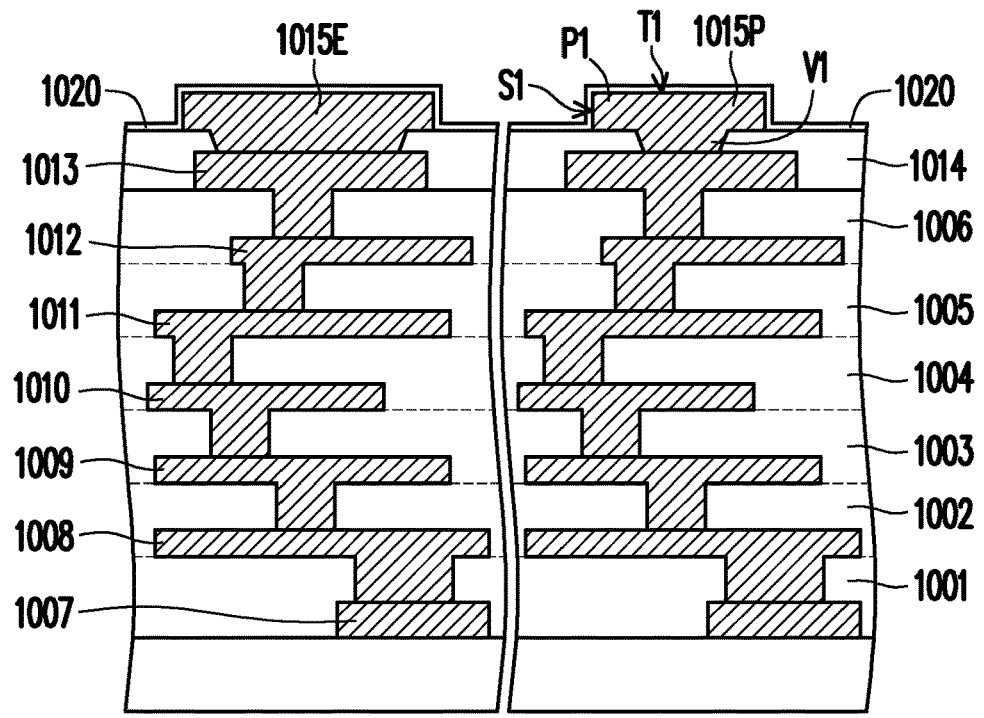

Referring to FIG. 5 and FIG. 6, a seed layer 1020 is blanketly formed over the peripheral pad 1015E and the core pad 1015P. As an example for forming the protective pattern 1025, a seed layer 1020 is formed over the dielectric layer 1014 and conformally covering the protruded pad portions P1 of the pads 1015E and 1015P. In some embodiments, the seed layer 1020 covers the sidewalls S1 and the top surfaces T1 of the top pad portions P1 of the pads 1015E and 1015P with a substantially uniform thickness. In some embodiments, the seed layer 1020 may include a single metal layer or a composite layer comprising a plurality of sub-layers formed of different metallic materials, formed by PVD, CVD or ALD. In one embodiment, the seed layer 1020 comprises a titanium layer formed by PVD. In one embodiment, the seed layer 1020 has a thickness ranging from about 50 nm to about 500 nm.

Figure 7:
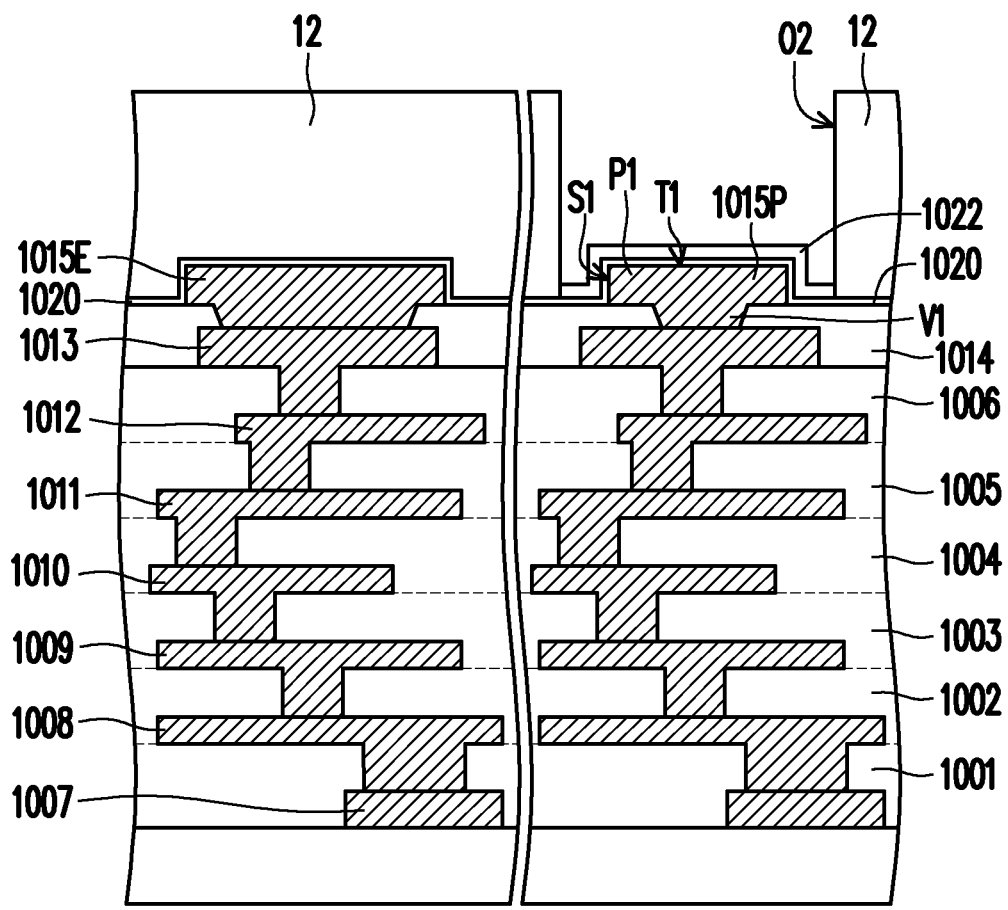

Referring to FIG. 7, a photoresist pattern 12 with at least an opening O2 is formed on the seed layer 1020. The photoresist pattern 12 may be formed by spin coating, for example. In some embodiments, the location of the opening O2 of the photoresist pattern 12 corresponds to the location of the core pad 1015P, and the opening O2 of the photoresist pattern 12 exposes the seed layer 1020 covering the core pad 1015P. Later, a reinforcement layer 1022 is formed on the seed layer 1020 exposed by the opening O2. In some embodiments, the reinforcement layer 1022 fully covers the seed layer 1020 on the sidewalls S1 and the top surface T1 of the top pad portion P1 of the pad 1015P with a substantially uniform thickness. In some embodiments, a metallic material with a greater hardness is formed inside the opening O2 of the photoresist pattern 12 and on the exposed part of the seed layer 1020. In some embodiments, the metallic material may be formed by plating, such as electroplating or electroless plating, CVD, ALD or PVD. In some embodiments, the metallic material of the reinforcement layer 1022 comprises a metal, like titanium (Ti), tantalum (Ta), nickel (Ni), tungsten (W), chromium (Cr), gold (Au), platinum (Pt), palladium (Pd), titanium nitride (TiN), tantalum nitride (TaN), titanium tungsten (TiW), nickel vanadium (NiV), nickel phosphide (NiP) or a combination thereof. In one embodiment, the reinforcement layer 1022 is a composite layer of a gold layer with a thickness ranging from 0.1 microns to about 5 microns and a nickel layer with a thickness ranging from 0.5 microns to about 10 microns on the gold layer. In some embodiments, when the reinforcement layer 1022 is a composite layer of multiple sub-layers, it is preferred to arrange the sub-layer with a higher or highest hardness as the outer or outermost sub-layer.

Depending on the material of the core pad 1015P, at least one material of the material(s) of the reinforcement layer 1022 has a hardness greater than that of the material of the core pad 1015P. For example, when the core pad 1015P is made of copper or copper alloys, the reinforcement layer 1022 at least includes a nickel layer having a hardness greater than copper.

Figure 8:
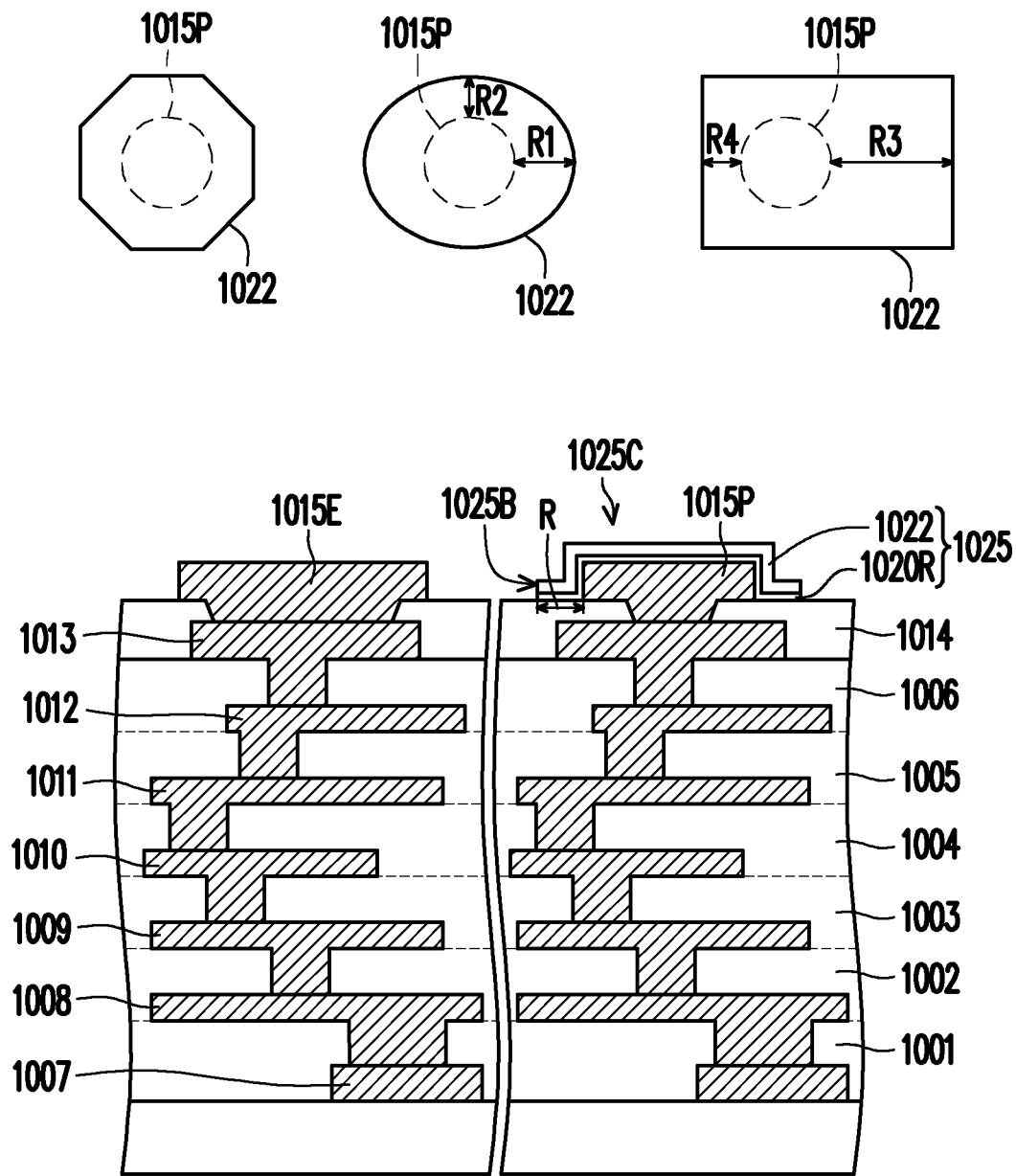

Referring to FIG. 8, in some embodiments, after the formation of the reinforcement layer 1022, the photoresist pattern 12 is removed. After removing the photoresist pattern 12, the exposed seed layer 1020 is also removed, while the seed layer 1020 covered by the reinforcement layer 1022 is not removed and remained. That is, using the reinforcement layer 1022 as the mask, the patterns of the reinforcement layer 1022 is transferred and the remained portion 1020R of the seed layer 1020 are substantially the same. In some embodiments, the photoresist pattern 12 is removed by an acceptable stripping process or ashing process, such as using an oxygen plasma. Once the photoresist pattern 12 is removed, the exposed seed layer 1020 is removed by, performing an etching process, such as wet or dry etching. The composite of the reinforcement layer 1022 (of the conductive material) and underlying remained portion 1020R form the protective pattern 1025. In some embodiments, as seen in FIG. 8, the protective pattern 1025 fully covers the sidewall(s) S1 and the top surface T1 of the core pad 1015P and extends beyond the core pad 1015P with an extension distance R. That is, the protective pattern 1025 may be formed in a hat shape with a crown portion 1025C and a brim portion 1025B surrounding the crown portion 1025C, and the brim portion 1025B extends beyond the core pad 1015P with the extension distance R.

From the exemplary schematic top views shown in the upper part of FIG. 8, using a round shaped pad as an example, it is seen that the reinforcement layer 1022 may be formed in an octagonal shape, an oval shape or a rectangular shape depending on the product requirements. In some embodiments, the reinforcement layer 1022 is formed with a span larger than the span (in dotted line) of the pad 1015P to fully cover its sidewall(s). In some embodiments, the core pad 1015P may be arranged at a center of the octagonal shaped reinforcement layer 1022 (as seen in the top view at the left upper part of FIG. 8). In some embodiments, the core pad 1015P may be arranged at a center of the oval shaped reinforcement layer 1022 (as seen in the top view at the middle upper part of FIG. 8) but the reinforcement layer 1022 extends beyond the span of the pad 1015P with a longer extension distance R1 (along the long axis) and a shorter extension distance R2 (along the short axis). In some embodiments, the core pad 1015P may be arranged within the rectangular shaped reinforcement layer 1022 (as seen in the top view at the right upper part of FIG. 8), and the reinforcement layer 1022 extends beyond the span of the pad 1015P with a longer extension distance R3 (to the right end) and a shorter extension distance R4 (to the left end).

Figure 9:
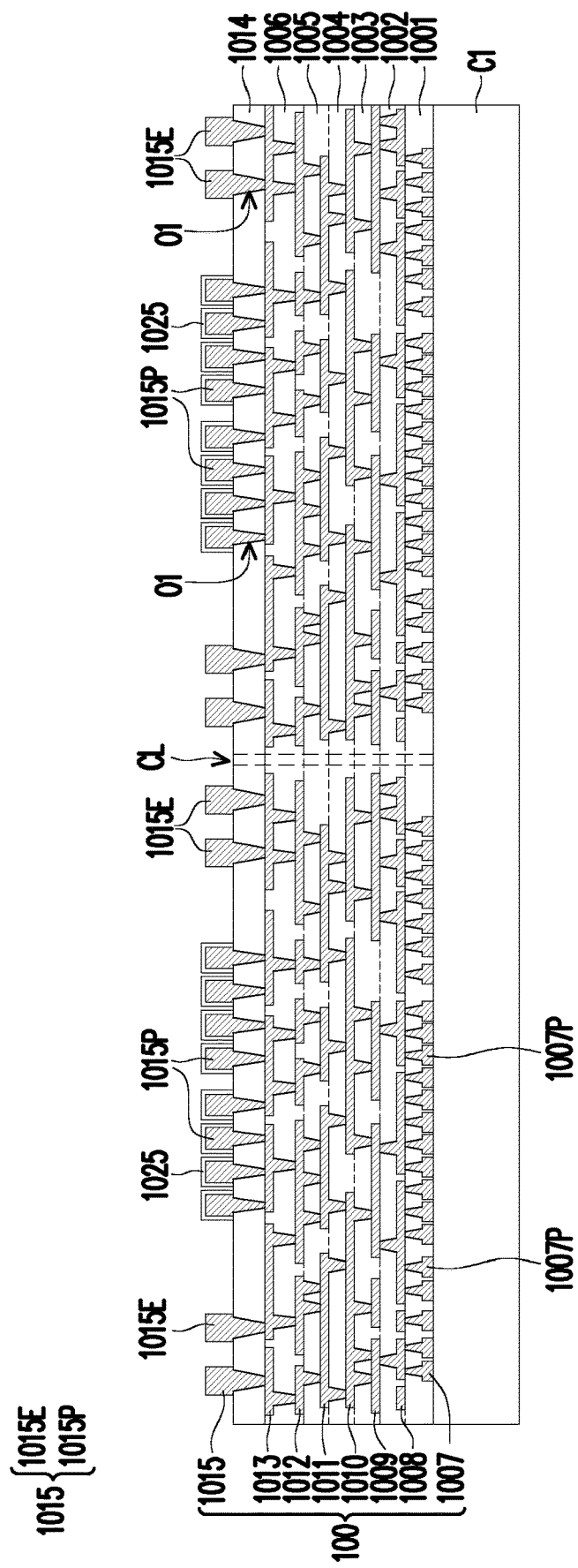

Referring to FIG. 9, each of the core pads 1015P has a protective pattern 1025 formed on the top pad portion P1 thereof, and the formation of the protective pattern 1025 as described in the previous paragraphs provides extra protection toward each core pad 1015P. As seen in FIG. 9, no protective layer or patterns is formed on the peripheral pads 1015E located besides the core pads 1015P.

Figure 10:
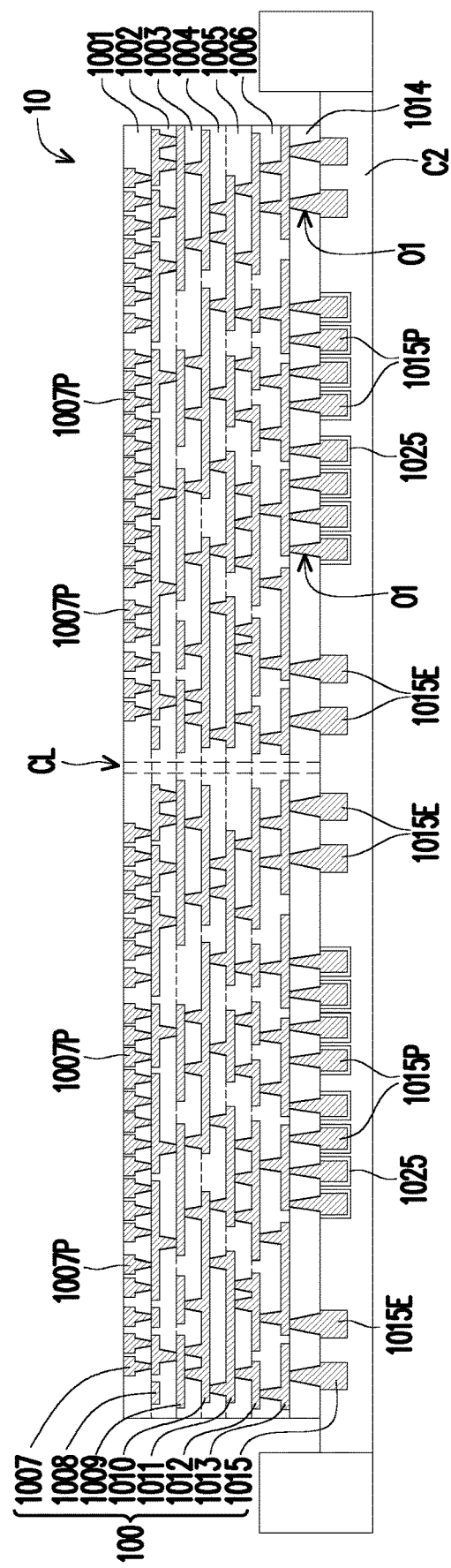
Figure 11:
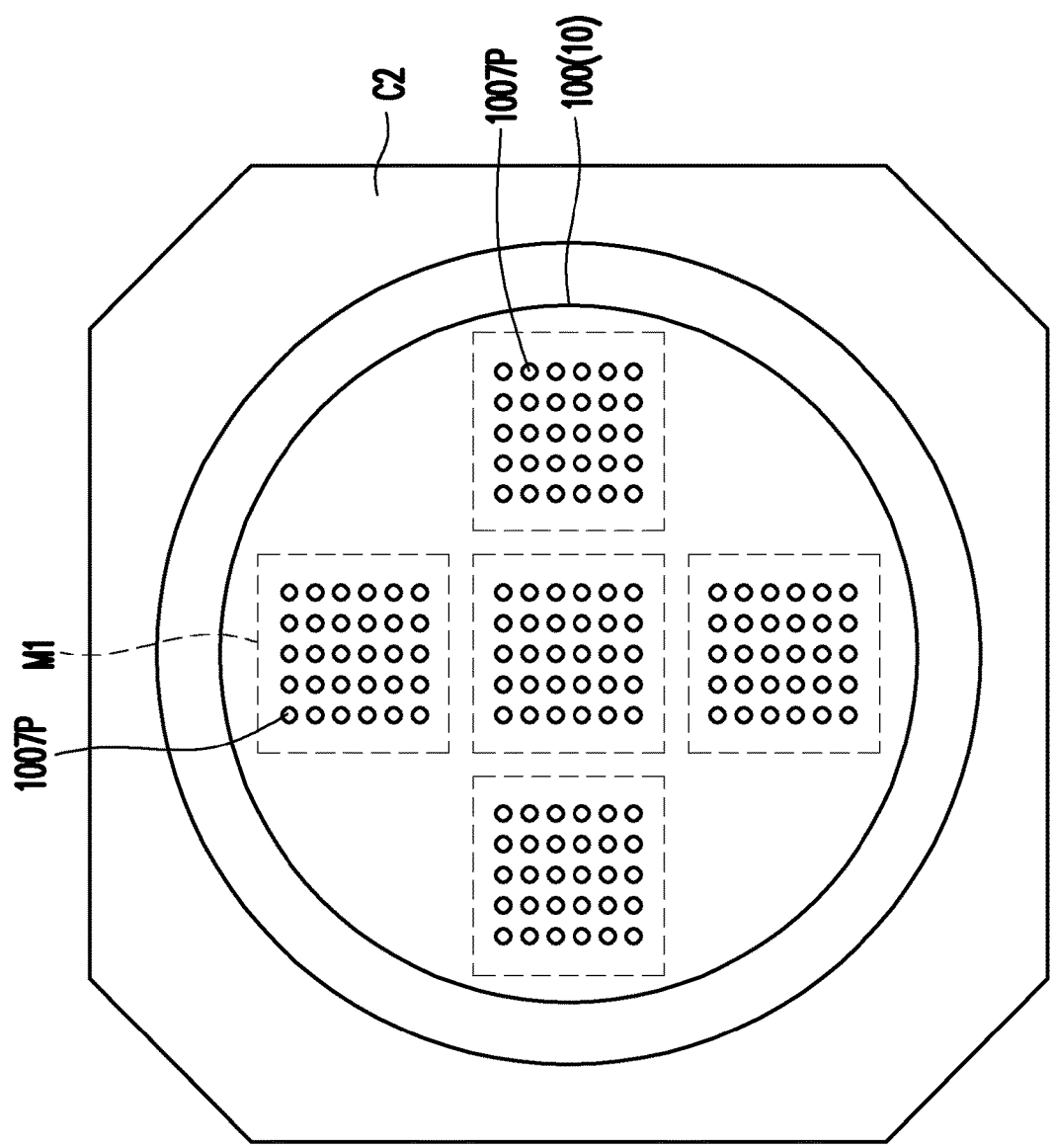

Referring to FIG. 9, FIG. 10 and FIG. 11, the carrier C1 is separated from the redistribution structure 100 and the carrier C1 is then removed. Later, the whole structure 10 including the redistribution structure 100 having the dielectric layer 1014 and the conductive layer 1015 is turned upside down and placed on a tape carrier C2. As the structure 10 is turned upside down, the peripheral pads 1015E and the core pads 1015P with the protective patterns 1025 are placed directly on the tape carrier C2, while the bump pads 1007P of the conductive layer 1007 (facing upward) are exposed. In some embodiments, the bump pads 1007P are arranged in arrays and are formed within the mounting regions M1. In some embodiments, the bumps pads 1007P may be formed in smaller pitches and dimensions than those of the core pads 1015P.

Figure 12:
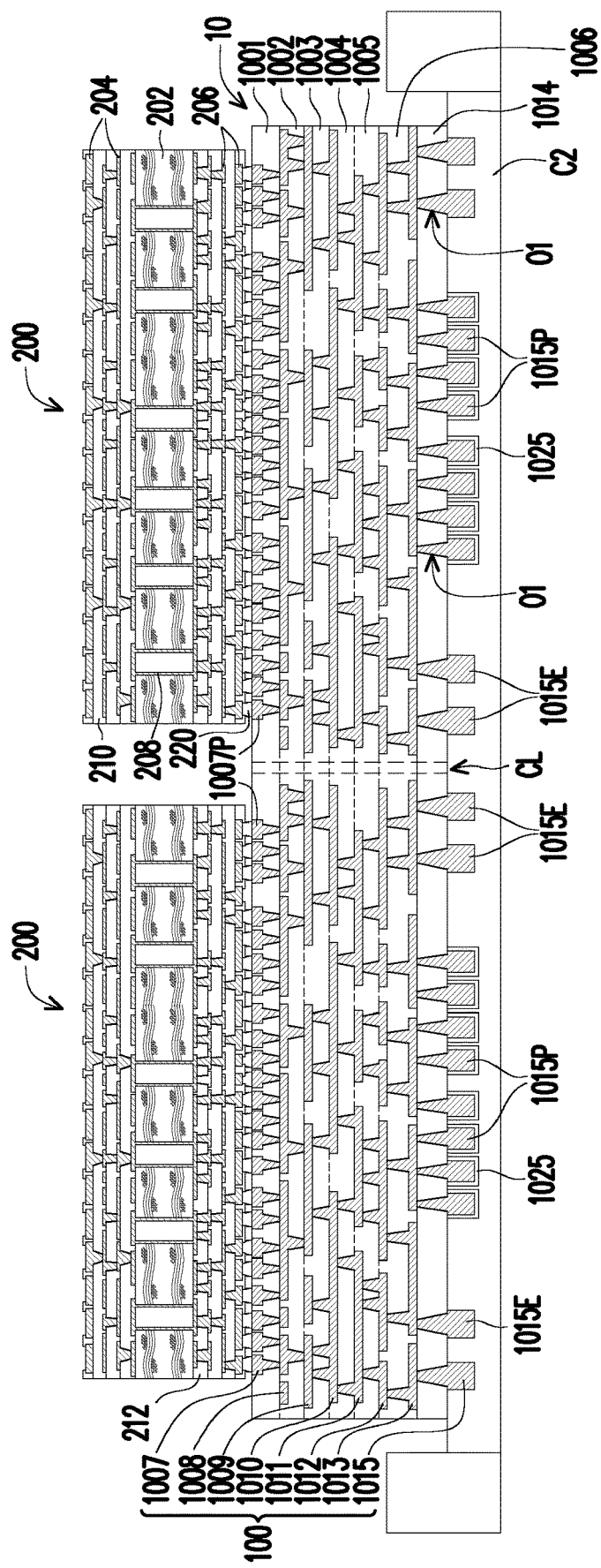
Figure 13:
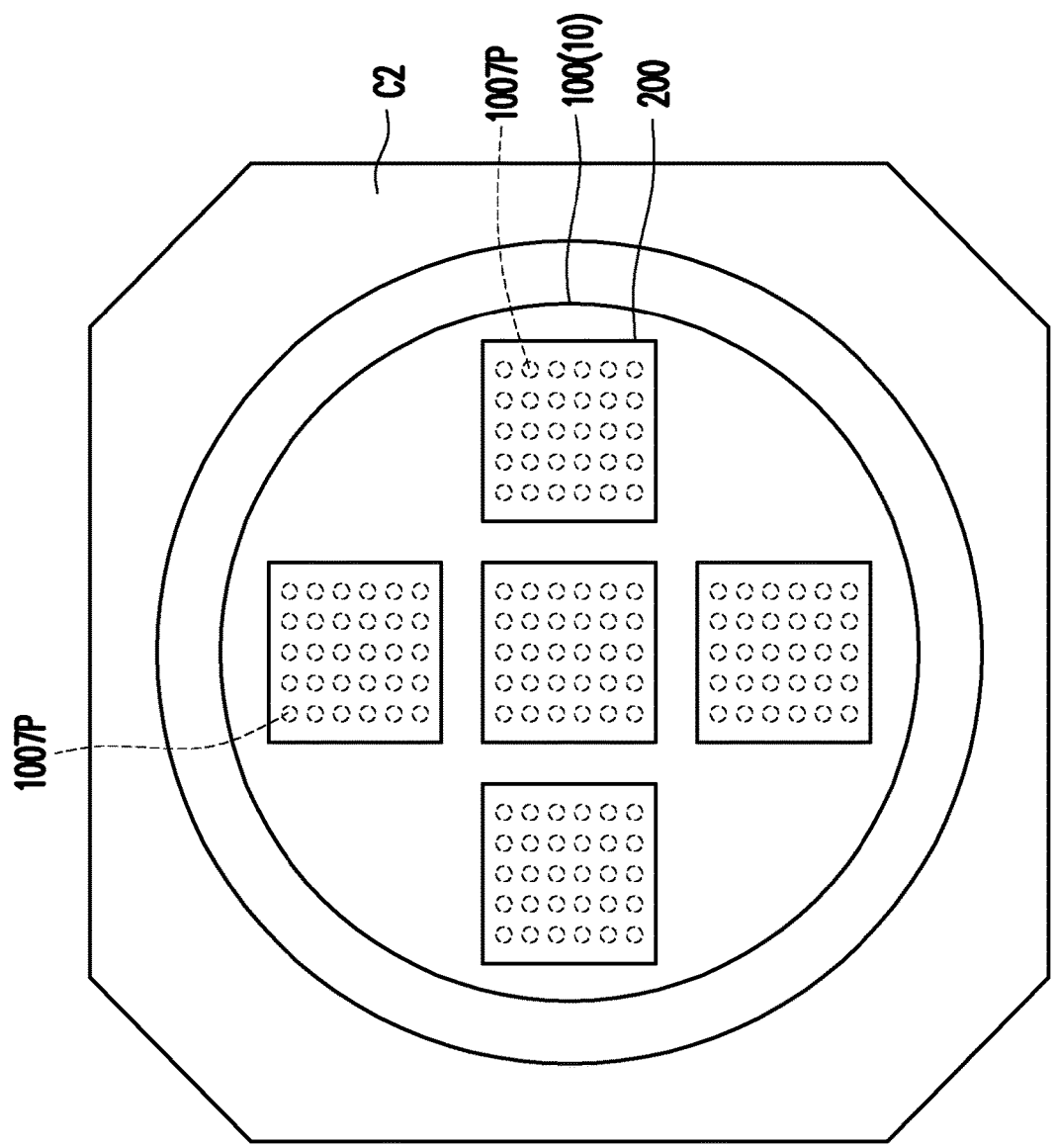

Referring to FIG. 12 and FIG. 13, interconnect substrates 200 are mounted onto the mounting regions M1 and are bonded to the redistribution structure 100 of the structure 10. In some embodiments, the interconnect substrates 200 can provide additional routing paths and further enhance the structural stability of the whole structure 10. For example, the interconnect substrate 200 can reduce warpage of the whole laminated structure. In some embodiments, the interconnect substrate 200 may be, for example, an interposer substrate or a laminate circuit substrate, and may include passive components but free of active devices. In some embodiments, the interconnect substrate 200 may include routing layers 204 and 206 formed on two opposite sides of a core substrate 202. In some embodiments, the core substrate 202 includes a material such as Ajinomoto build-up film (ABF), a pre-impregnated composite fiber ("prepreg") material, epoxy resins, fiberglass-reinforced resin materials, polyimide materials, paper, glass fiber, non-woven glass fabric, ceramic materials, or a combination thereof. In some embodiments, the core substrate 202 may be a double-sided copper-clad laminate (CCL) substrate. In some embodiments, the routing layers 204 and 206 formed on two sides of the core substrate 202 are connected by through vias 208 extending through the core substrate 202, and the routing layers 204/206 are sandwiched between dielectric layers 210/212. In some embodiments, the routing layers 204/206 may comprise one or more layers of copper, nickel, aluminum, other conductive materials, or a combination thereof. In some embodiments, the dielectric layers 210/212 may be include materials such as a build-up material, ABF, a prepreg material, a laminate material, or a suitable polymeric material. The interconnect substrates 200 may include more or fewer routing layers and are not limited by the structure shown in the figures.

As seen in FIG. 12, in some embodiments, the interconnect substrates 200 are bonded to the bump pads 1007P of the redistribution structure 100 through bumps 220. In some embodiments, the interconnect substrates 200 are bonded to the redistribution structure 100 through performing a reflow process. In some embodiments, the bumps 220 may be formed on the outermost routing layer of the interconnect substrate 200, and the bumps 220 may be solder bumps, ball grid array (BGA) connectors, metal pillars, controlled collapse chip connection (C4) bumps, micro bumps, or the like. For example, the bumps 220 may include a conductive material such as solder, copper, aluminum, gold, nickel, silver, tin, or a combination thereof.

Figure 14:
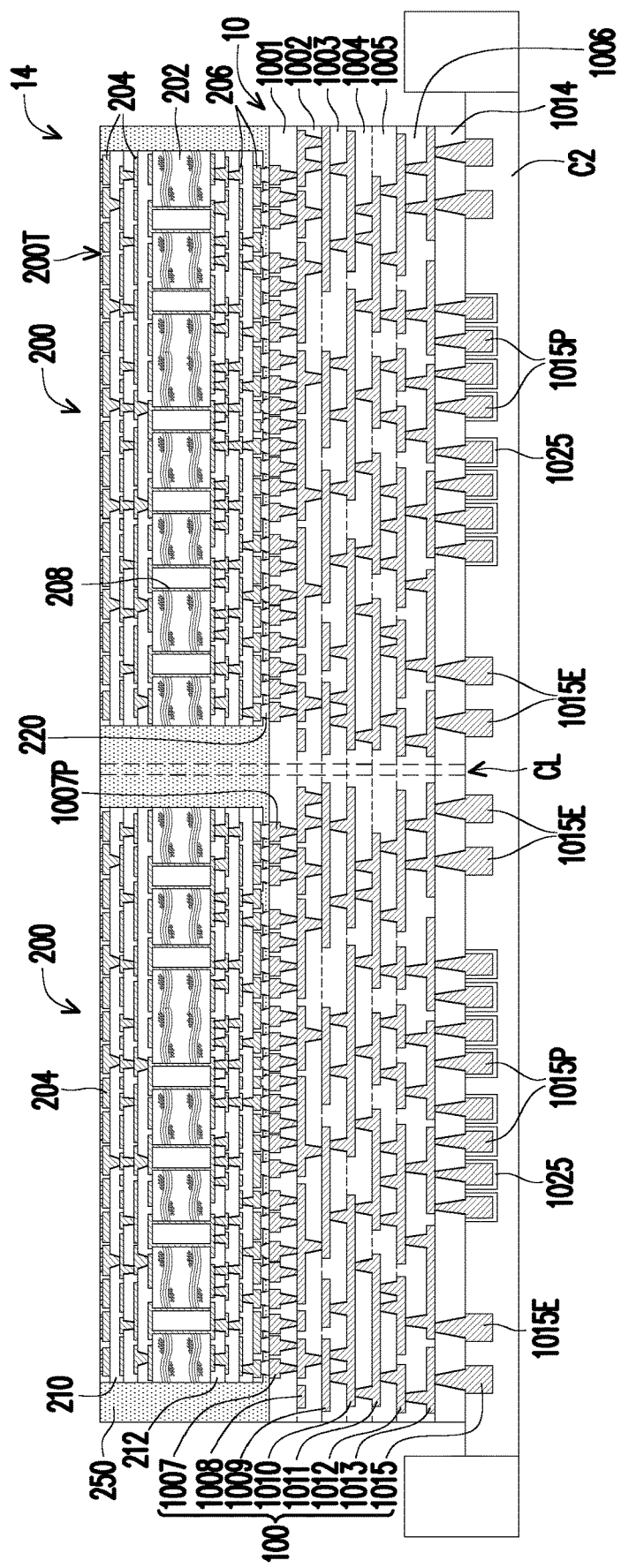
Figure 15:
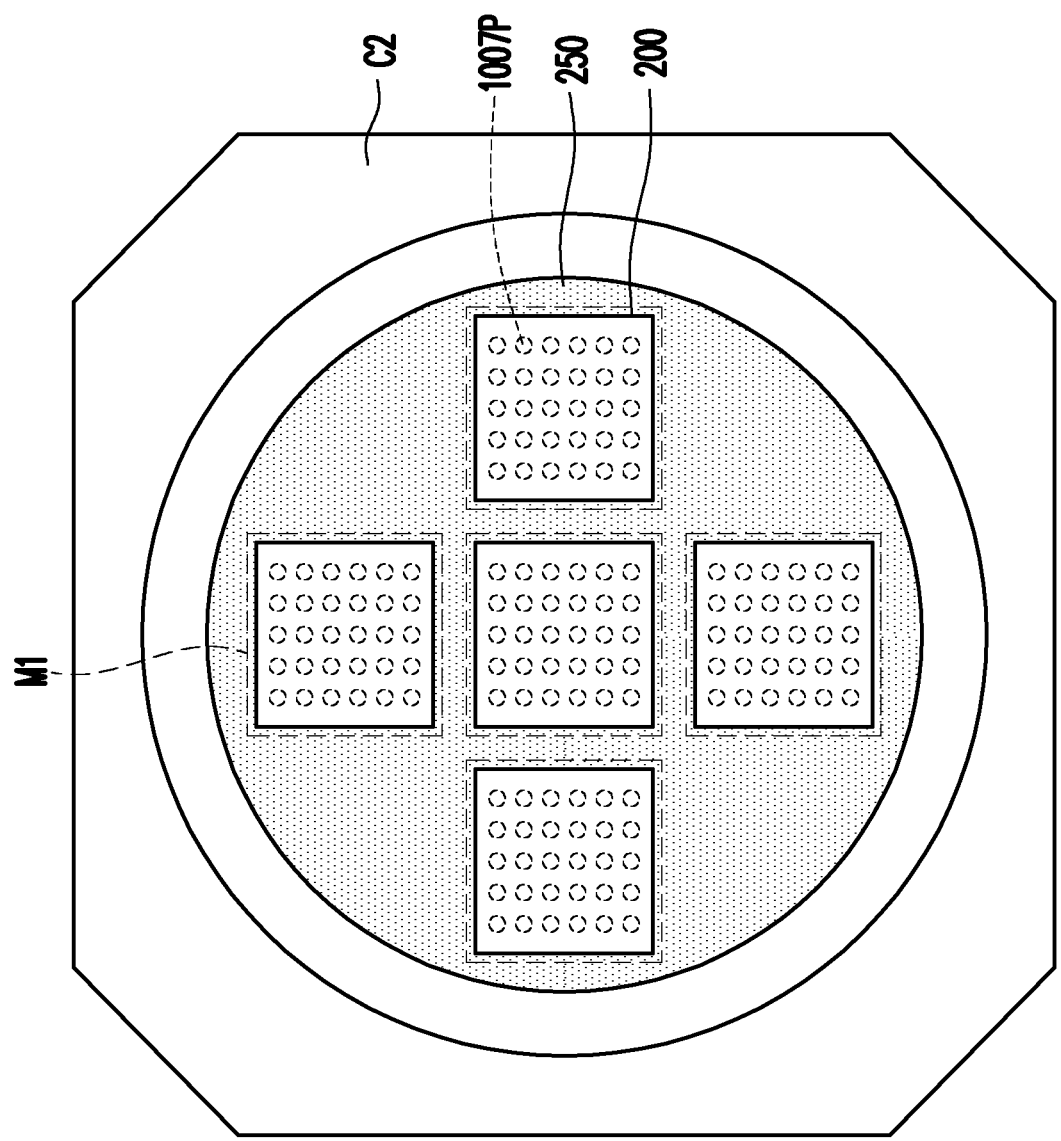

Referring to FIG. 14 and FIG. 15, an insulating encapsulant 250 is formed over the interconnect substrates 200 and on the redistribution structure 100 to laterally encapsulate the interconnect substrates 200 and to form a molded structure 14. In some embodiments, the insulating encapsulant 250 includes a molding compound, a polymeric material such as polyimide, epoxy resins, acrylic resins, phenol resins, BCB, PBO, or other suitable polymer-based dielectric materials. For example, the insulating encapsulant 250 may be formed by a sequence of over-molding and planarization steps. In some embodiments, the formation of the insulating encapsulant 250 involves forming an insulating material (not shown) on the redistribution structure 100 covering the interconnect substrates 200 through, for example, a compression molding process, and the interconnect substrates 200 are fully covered and encapsulated by the insulating material. Thereafter, the insulating material is partially removed or grinded until the top surfaces 200T of the interconnect substrates 200 are exposed, so as to form the insulating encapsulant 250. In some embodiments, the planarization process includes a mechanical grinding process and/or a chemical mechanical polishing (CMP) process. In some embodiments, after performing the planarization process, the top surfaces 200T of the interconnect substrates 200 are exposed and the metallization pattern of the outermost routing layer 204 is revealed.

As seen in FIG. 15, with the formation of the insulating encapsulant 250, the molded structure 14 is formed to include a plurality of substrate units at locations corresponding to the mounting regions M1, each substrate unit includes one interconnect substrate 200.

Figure 16:
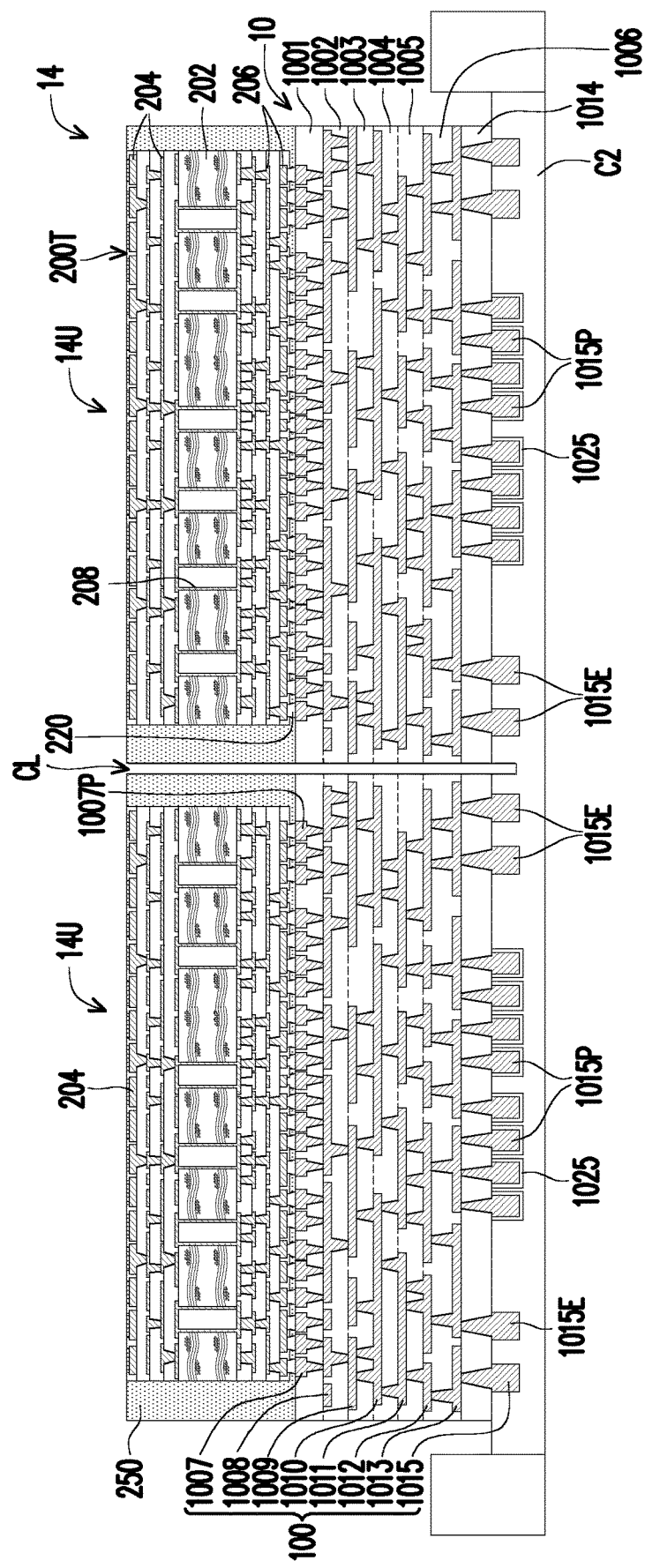
Figure 17:
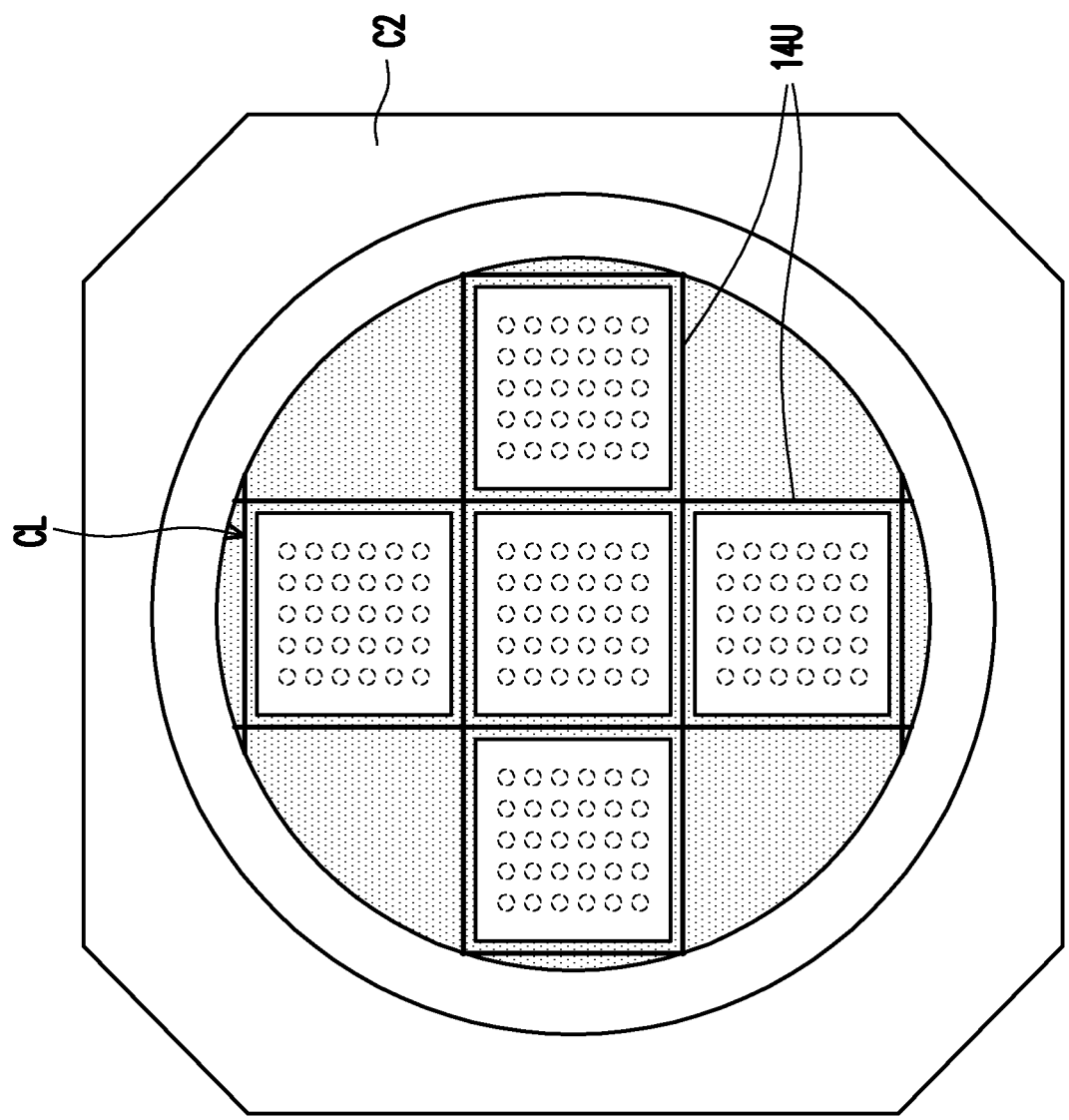

In some embodiments, referring to FIG. 16 and FIG. 17, a singulation process is performed to dice or cut the molded structure 14 into individual substrate units 14U, For example, by cutting through the wafer-like molded structure 14 along the scribe lanes CL arranged along the mounting regions M1, individual substrate units 14U are obtained. In some embodiments, the singulation process typically involves performing a mechanical dicing process with a rotating blade and optionally pre-cutting using a laser beam. Later, the tape carrier C2 is separated from the substrate units 14U following singulation. It is understood that the number, the shape and the relative arrangement of the substrate units 14U are exemplary and the disclosure is not limited by the number, the shape and the relative arrangement of the substrate units 14U shown in the figures.

Figure 18:
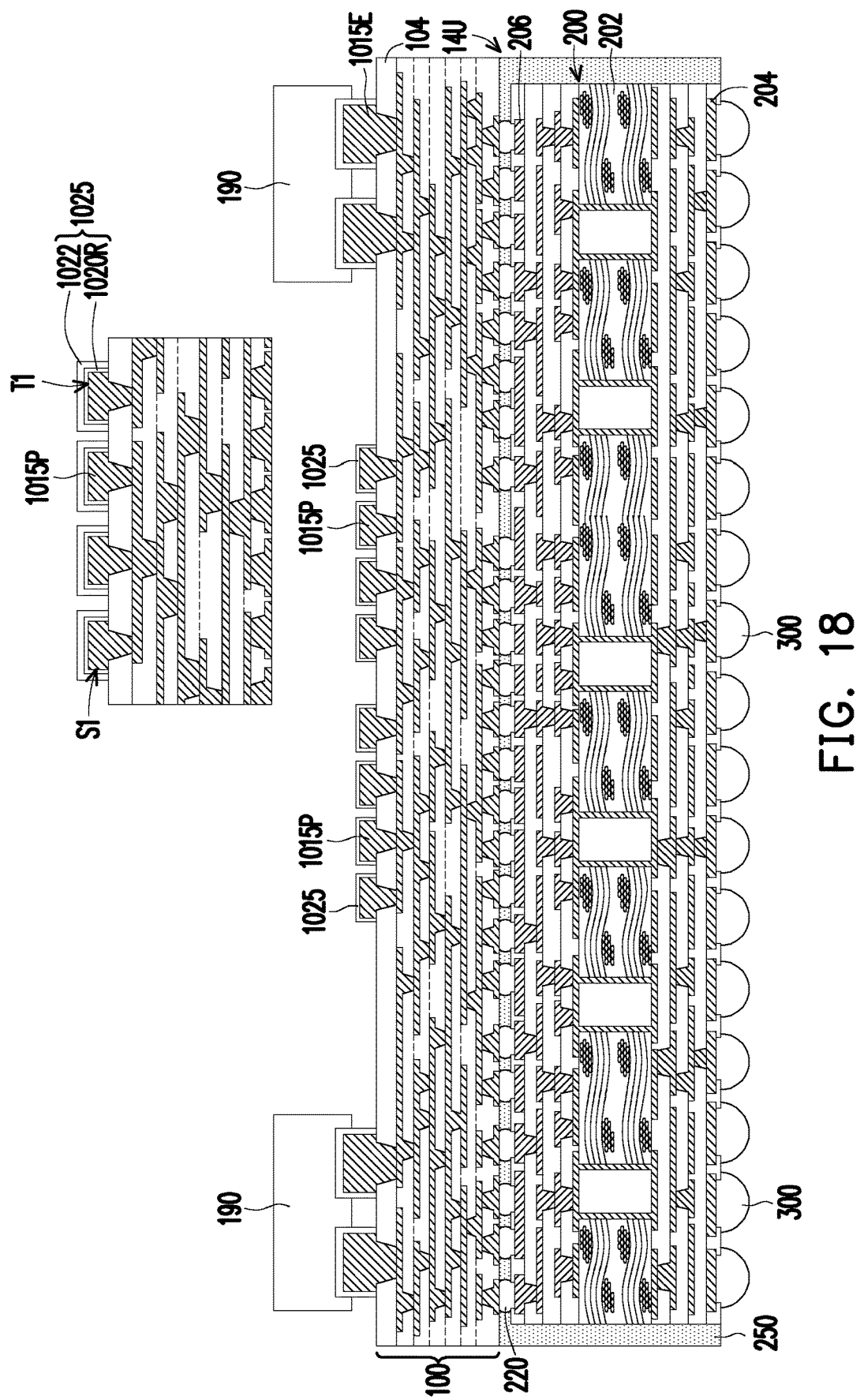
FIG. 18 is a schematic cross-sectional view of an exemplary substrate unit structure with pads in accordance with embodiments of the present disclosure.

FIG. 18 is a schematic cross-sectional view of an exemplary substrate unit structure with pads in accordance with embodiments of the present disclosure.

In the schematic cross-sectional view of FIG. 18, a single substrate unit 14U is shown for illustrative purposes only, and the substrate unit 14U is substantially the same as the substrate unit 14U as illustrated in FIG. 16 with the same or similar parts are labelled with the same reference numerals, and the substrate unit 14U may be obtained through the manufacturing processes as described in the previous embodiments. In some embodiments, as seen in FIG. 18, conductive connectors 300 are formed on the exposed routing layer 204 at the bottom surface of the substrate unit 14U. In some embodiments, passive components 190 are bonded to the peripheral pads 1015E of the redistribution structure 100 of the substrate unit 14U. For example, the passive components 190 may be resistors, capacitors, inductors, or a combination thereof. In some embodiments, the passive components 190 include capacitors. In some embodiments, the substrate unit 14U having the core pads 1015P safeguarded by the protective patterns 1025 is applicable as the probe card substrate, and the core pads 1015P that are subject to repeated probing of the later applied probe head are reinforced by the protective patterns 1025.

As shown in the enlarge partial view of FIG. 18, the core pads 1015P are covered with the protective patterns 1025. Each protective pattern 1025 includes a laminate of the reinforcement layer 1022 and the seed pattern 1020R. In some embodiments, as seen in FIG. 18, the protective pattern 1025 fully covers the sidewalls S1 and the top surfaces T1 of the core pads 1015P. Herein, the protective pattern 1025 may be formed like a crown shape fully covering the sidewalls S1 and the top surfaces T1 of the core pads 1015P. As previously described in FIG. 8, the protective pattern 1025 may be formed in a hat shape with a crown portion 1025C and a brim portion 1025B surrounding the crown portion 1025C, and the brim portion 1025B extends beyond the core pad 1015P with an extension distance R.

Figure 19:
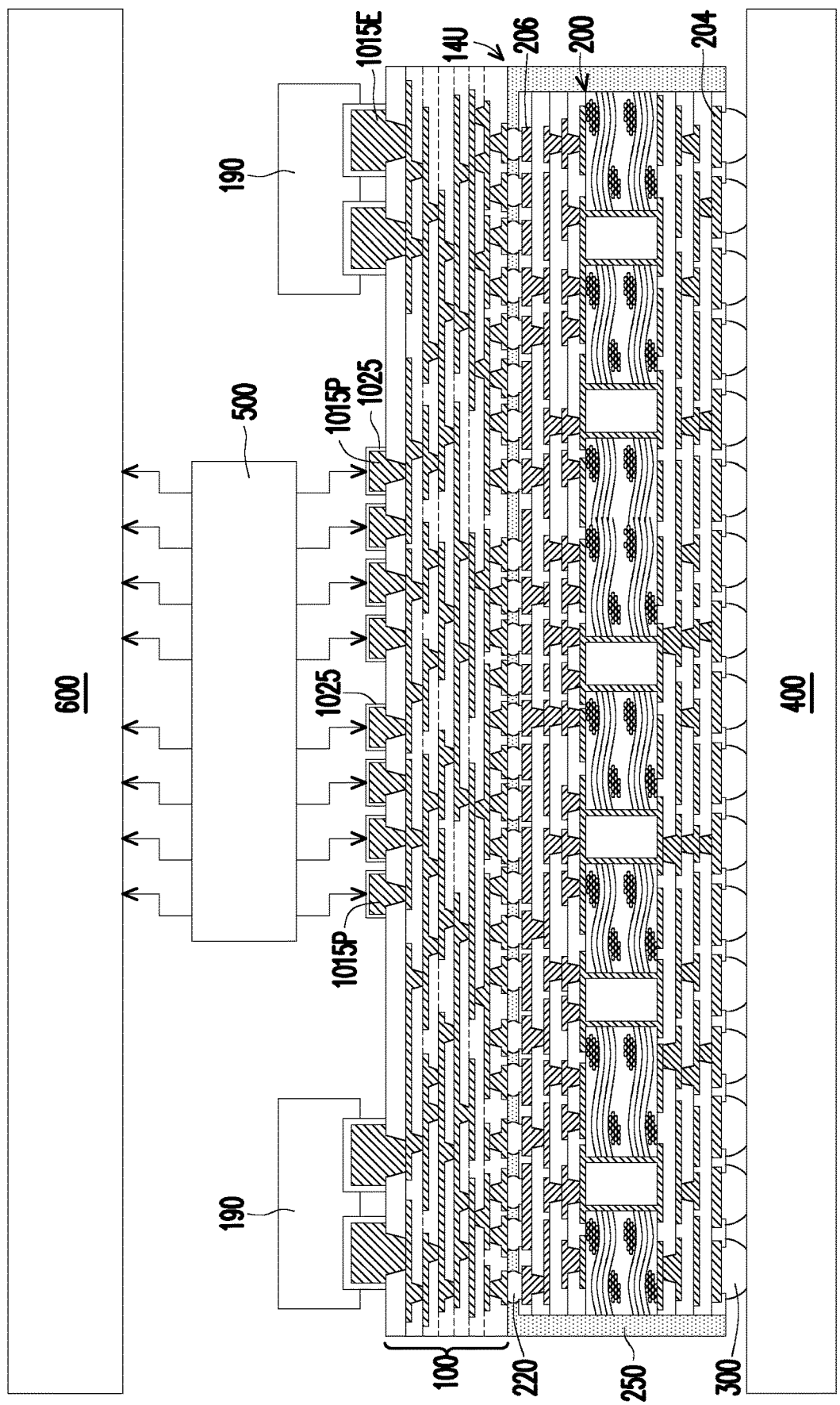
FIG. 19 is a schematic cross-sectional view of an exemplary probe card structure with the probe card substrate applicable for testing technology in accordance with some embodiments of the present disclosure.

FIG. 19 is a schematic cross-sectional view of an exemplary probe card structure with the probe card substrate applicable for testing technology in accordance with some embodiments of the present disclosure.

Referring to FIG. 19, the substrate unit 14U is substantially the same as the substrate unit 14U as illustrated in FIG. 18 with the same or similar parts are labelled with the same reference numerals, and the substrate unit 14U may be obtained through the manufacturing processes as described in the previous embodiments. In some embodiments, the substrate unit 14U is further connected with a circuit substrate 400 through the conductive connectors 300. In some embodiments, the circuit substrate 400 includes a printed circuit board (PCB) and the conductive connectors 300 include solder balls, BGA bumps or C4 bumps. Referring to FIG. 19, a probe head 500 is electrically coupled with the substrate unit 14U and a device-under-test 600 to establish the electrical connection for the testing process. Referring to FIG. 19, it is seen that the probes (represented by the arrows) of the probe head 500 are in contact with the protective patterns 1025 on the core pads 1015P.

As the core pads are protected by the protective patterns, better oxidation and moisture resistance is provided. Also, through the formation of the protective pattern with increased hardness, probing endurance of the pads of the probe card substrate is improved and the reliability of the probe pads and the conduction of electrical connections between the probe head and the probe card substrate and between the probe card and the device(s) under test (DUT) are also enhanced. The structure described herein may be applied to other fabrication processes for the pad fabrication in any laminated substrate or circuit substrate.

In some embodiments of the present disclosure, a laminated structure is provided. The structure includes an interconnect substrate having a first surface and a second surface opposite to the first surface, an insulating encapsulant laterally wrapping the interconnect substrate, and a redistribution structure disposed on the first surface of the interconnect substrate and electrically connected with the interconnect substrate. The redistribution structure has a third surface facing the first surface and a fourth surface opposite to the third surface. The redistribution structure includes first pads, second pads located beside the first pads, and protective patterns disposed on the first pads and covering the first pads. The first pads include pad portions protruded from the fourth surface and the protective patterns are in contact with sidewalls and top surfaces of the pad portions of the first pads.

In some embodiments of the present disclosure, a laminated structure is provided. The laminated structure includes a substrate unit, conductive connectors disposed on a bottom surface of the substrate unit, and passive components disposed on a top surface of the substrate unit. The substrate unit includes an interconnect substrate, an insulating encapsulant laterally wrapping the interconnect substrate, and a redistribution structure disposed on the interconnect substrate and the insulating encapsulant. The redistribution structure is electrically connected with the interconnect substrate. The redistribution structure includes first pads, second pads located beside the first pads, and protective patterns disposed on the first pads and covering the first pads. The first pads include pad portions protruded from a surface of the redistribution structure, and the protective patterns include crown portions fully covering sidewalls and top surfaces of the pad portions of the first pads.

In some embodiments of the present disclosure, a method for forming a laminated structure includes the following process steps. A redistribution structure is formed by sequentially forming dielectric layers and conductive layers in alternation. The redistribution layer is formed with a topmost dielectric layer and a topmost conductive layer having first pads and second pads, and the first and second pads are partially protruded from the topmost dielectric layer. Protective patterns are formed on the first pads with the second pads being exposed and free of the protective patterns. Interconnect substrates are provided and bonded with the redistribution structure. An insulating encapsulant is formed to laterally encapsulate the interconnect substrates to form a molded structure. A singulation process is performed to the molded structure to form individual substrate units.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A laminated structure, comprising: an interconnect substrate having a first surface and a second surface opposite to the first surface; an insulating encapsulant laterally wrapping the interconnect substrate; and a redistribution structure disposed on the first surface of the interconnect substrate and electrically connected with the interconnect substrate, wherein the redistribution structure has a third surface facing the first surface and a fourth surface opposite to the third surface, the redistribution structure includes first pads, second pads located beside the first pads, and protective patterns disposed on the first pads and covering the first pads, wherein the first pads include pad portions protruded from the fourth surface and the protective patterns are in contact with and fully cover outer sidewalls and top surfaces of the pad portions of the first pads, wherein at least one protective pattern extends beyond the below first pad and extends along and contacts the fourth surface with a lateral distance.

2. The structure of claim 1, wherein at least one protective pattern of the protective patterns includes a reinforcement layer having a hardness larger than that of at least one first pad of the first pads.

3. The structure of claim 2, wherein a material of the reinforcement layer includes titanium (Ti), tantalum (Ta), nickel (Ni), tungsten (W), chromium (Cr), gold (Au), platinum (Pt), palladium (Pd), titanium nitride (TiN), tantalum nitride (TaN), titanium tungsten (TiW), nickel vanadium (NiV), nickel phosphide (NiP) or a combination thereof, and a material of the first pads includes copper.

4. The structure of claim 2, wherein the at least one protective pattern further includes a seed layer beneath the reinforcement layer.

5. The structure of claim 4, wherein the seed layer includes a titanium layer, and the reinforcement layer includes a gold layer and a nickel layer located on the gold layer.

6. The structure of claim 1, wherein at least one protective pattern of the protective patterns has a distribution area larger than a distribution area of at least one first pad of the first pads.

7. The structure of claim 1, wherein the protective patterns covering on the first pads extend beyond distribution areas of the first pads and extend along and over the fourth surface with lateral extension distances.

8. The structure of claim 1, further comprising passive components connected to the second pads, wherein the second pads are free of protective patterns.

9. A laminated structure, comprising: a substrate unit; conductive connectors disposed on a bottom surface of the substrate unit; and passive components disposed on a top surface of the substrate unit, wherein the substrate unit includes: an interconnect substrate; an insulating encapsulant laterally wrapping the interconnect substrate; and a redistribution structure disposed on the interconnect substrate and the insulating encapsulant, the redistribution structure being electrically connected with the interconnect substrate, wherein the redistribution structure includes first pads, second pads located beside the first pads, and protective patterns disposed on the first pads and fully covering the first pads, wherein the first pads include pad portions protruded from a surface of the redistribution structure and the protective patterns include crown portions fully covering outer sidewalls and top surfaces of the pad portions of the first pads, and at least one protective pattern extends beyond the below first pad and extends along and contacts the surface of the redistribution structure with a lateral distance.

10. The structure of claim 9, wherein the protective patterns further include brim portions connected with and surrounding the crown portions, and the brim portions extend beyond distribution areas of the first pads with lateral extension distances.

11. The structure of claim 9, wherein at least one protective pattern of the protective patterns has a distribution area larger than a distribution area of at least one first pad of the first pads.

12. The structure of claim 9, wherein the passive components are connected to the second pads without the protective patterns existing there-between.

13. The structure of claim 9, wherein each of the protective patterns includes a reinforcement layer having a hardness larger than that of the underlying first pad.

14. The structure of claim 13, wherein a material of the reinforcement layer includes titanium (Ti), tantalum (Ta), nickel (Ni), tungsten (W), chromium (Cr), gold (Au), platinum (Pt), palladium (Pd), titanium nitride (TiN), tantalum nitride (TaN), titanium tungsten (TiW), nickel vanadium (NiV), nickel phosphide (NiP) or a combination thereof, and a material of the first pads includes copper.

15. The structure of claim 9, wherein at least one protective pattern of the protective patterns includes a composite of a titanium layer, a gold layer and a nickel layer laminated in sequence.

16. A structure, comprising: an interconnect substrate having a first surface and a second surface opposite to the first surface; an insulating encapsulant laterally wrapping the interconnect substrate; and a redistribution structure disposed on the first surface of the interconnect substrate and electrically connected with the interconnect substrate, wherein the redistribution structure has a third surface facing the first surface and a fourth surface opposite to the third surface, the redistribution structure includes first pads, second pads located beside the first pads, and protective patterns disposed on the first pads; and passive components, disposed on the fourth surface of the redistribution structure, wherein the first pads include pad portions protruded from the fourth surface and the protective patterns contact and cover outer sidewalls and top surfaces of the pad portions of the first pads, and at least one protective pattern extends beyond the below first pad and extends along and contacts the fourth surface with a lateral distance.

17. The structure of claim 16, wherein some of the protective patterns include crown portions and brim portions connected with and surrounding the crown portions, the crown portions cover the pad portions, and the brim portions extend beyond distribution areas of the first pads with lateral extension distances.

18. The structure of claim 16, wherein at least one protective pattern of the protective patterns has a distribution area larger than a distribution area of at least one first pad of the first pads.

19. The structure of claim 16, further comprising conductive connectors disposed on the second surface of the interconnect structure, wherein the conductive connectors are electrically connected with the passive components through the interconnect structure and the redistribution structure, and the passive components are connected to the second pads without the protective patterns existing there-between.

20. The structure of claim 16, wherein each of the protective patterns includes a reinforcement layer having a hardness larger than that of the underlying first pad.

* * * * *